(12) United States Patent
Mortazavi et al.

(10) Patent No.: US 10,666,192 B2
(45) Date of Patent: May 26, 2020

(54) ATTENUATION OF FLICKER NOISE IN BIAS GENERATORS

(71) Applicant: QUALCOMM Incorporated, San Diego, CA (US)

(72) Inventors: Seyed Yahya Mortazavi, San Jose, CA (US); ChuanKang Liang, Fremont, CA (US); Arvind Keerti, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/144,008

(22) Filed: Sep. 27, 2018

(65) Prior Publication Data
US 2020/0106388 A1 Apr. 2, 2020

(51) Int. Cl.
*H03B 5/00* (2006.01)
*H03B 5/12* (2006.01)
*H03F 1/02* (2006.01)

(52) U.S. Cl.
CPC .......... *H03B 5/1228* (2013.01); *H03B 5/124* (2013.01); *H03B 5/1215* (2013.01); *H03F 1/0211* (2013.01)

(58) Field of Classification Search
CPC .................................................. H03B 5/1228
See application file for complete search history.

(56) References Cited

U.S. PATENT DOCUMENTS

| | | | |
|---|---|---|---|
| 6,531,924 B2 * | 3/2003 | Aparin | H03F 1/301 327/247 |
| 6,750,726 B1 | 6/2004 | Hung et al. | |
| 6,987,425 B1 | 1/2006 | Sutardja | |
| 7,057,445 B2 * | 6/2006 | Hayakawa | G05F 3/205 323/315 |
| 8,254,504 B2 | 8/2012 | Webster et al. | |
| 8,508,199 B2 * | 8/2013 | Arigliano | G05F 1/573 323/274 |

FOREIGN PATENT DOCUMENTS

CN 102055422 A 5/2011

OTHER PUBLICATIONS

Kim J., et al., "Low-Power, Low-Cost CMOS Direct-Conversion Receiver Front-End for Multistandard Applications", IEEE Journal of Solid-State Circuits, vol. 48, No. 9, Sep. 2013, pp. 2090-2103.

* cited by examiner

*Primary Examiner* — Hai L Nguyen
(74) *Attorney, Agent, or Firm* — Paradice and Li LLP/Qualcomm

(57) ABSTRACT

This disclosure provides systems and apparatuses for reducing flicker noise in output signals provided by a radio frequency (RF) amplifier. In some implementations, the RF amplifier may include a bias generator to provide one or more bias signals to control operating points of devices and circuits of the RF amplifier. The bias generator may include a feedback circuit to generate a current to attenuate flicker noise within the bias generator. In some implementations, the feedback circuit may receive a bias voltage and may generate the current based on a frequency of the bias voltage.

16 Claims, 5 Drawing Sheets

ATTENUATION OF FLICKER NOISE IN BIAS GENERATORS

TECHNICAL FIELD

This disclosure relates generally to signal processing, and specifically to attenuation of flicker noise in radio frequency amplifiers.

DESCRIPTION OF THE RELATED TECHNOLOGY

Communication devices often use amplifiers to receive and transmit communication signals. For example, a wireless communication device may use one or more amplifiers to amplify radio frequency (RF) signals that are received by an antenna. In another example, the wireless communication device may use a driver amplifier to increase power of a modulated RF signal prior to transmission through the antenna.

Amplifiers may be susceptible to flicker noise. Flicker noise is sometimes referred to as "1/f" noise since the power of the flicker noise is inversely proportional to signal frequency. Flicker noise may negatively affect an amplifier's performance by appearing in frequency bands that may be near a carrier frequency or other frequencies of interest. For example, low frequency flicker noise may be shifted into higher frequencies by mixing operations, frequency spurs, or intermodulation products associated with signal processing of the amplified signals.

Flicker noise may be dependent upon feature sizes of the devices (e.g., transistors) used to implement the amplifier. As the device feature sizes become smaller, flicker noise increases. Therefore, as integrated circuits are reduced in size and the features sizes of the associated devices become smaller, flicker noise power increases.

Conventional approaches to reducing flicker noise are based on filtering by resistor/capacitor (R-C) networks and/or increasing the device sizes of devices used in the amplifier. R-C networks may require large amounts of area to implement, making size reduction difficult. Further, in some cases device sizes may be constrained and may not easily be increased to reduce flicker noise. Thus, there exists a need to reduce flicker noise in amplifier designs without using R-C networks or increasing device sizes.

SUMMARY

The systems, methods and devices of this disclosure each have several innovative aspects, no single one of which is solely responsible for the desirable attributes disclosed herein.

One innovative aspect of the subject matter described in this disclosure can be implemented in a communication device that amplifies radio frequency (RF) signals. The communication device may include a bias generator configured to provide a bias voltage. The bias generator may include an amplifier comprising a first input terminal configured to receive a reference voltage, a second input terminal, and an output terminal configured to provide an output bias voltage. The bias generator may also include a feedback circuit comprising an input terminal coupled to the output terminal of the amplifier and an output terminal coupled to the second input terminal of the amplifier and configured to sink a first current based on a direct current (DC) output voltage of the amplifier.

Another innovative aspect of the subject matter described in this disclosure can be implemented as an amplifier comprising a gain stage configured to provide an output signal based at least in part on an input signal and an output bias voltage and a bias generator comprising a bias-generating amplifier comprising a first input terminal configured to receive a reference voltage, a second input terminal, and an output terminal configured to provide an output bias voltage. The bias generator may also include a feedback circuit comprising an input terminal coupled to the output terminal of the bias generating amplifier and an output terminal coupled to the second input terminal of the bias-generating amplifier and configured to sink a first current based on a direct current (DC) output voltage of the bias-generating amplifier.

Another innovative aspect of the subject matter described in this disclosure can be implemented as method comprising generating, by an amplifier, a bias voltage based on a reference voltage and a reference current, and receiving, by a feedback circuit, a feedback current based on the bias voltage, wherein the feedback current is subtracted from the reference current.

BRIEF DESCRIPTION OF THE DRAWINGS

Aspects of this disclosure are illustrated by way of example, and not by way of limitation, in the figures of the accompanying drawings and in which like reference numerals refer to similar elements.

Like reference numbers and designations in the various drawings indicate like elements.

DETAILED DESCRIPTION

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, system or network that is capable of transmitting, receiving, and processing signals, including radio frequency (RF) signals. By way of example, the described implementations may be realized in devices, systems, or networks that operate according to any of the IEEE 802.11 specifications, or any of the IEEE 802.15 specifications, the Bluetooth® standard, code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or internet of things (IOT) network, such as a system utilizing 3G, 4G or 5G, or further implementations thereof, technology.

An amplifier is a circuit that can increase the power of a signal. For example, an RF amplifier may increase the power of an RF signal by increasing a voltage and/or current associated with the RF signal. Amplifiers often include one or more bias generators. A bias generator may provide a stable voltage or current (e.g., a bias signal) that may control operating points of circuits (transistors, current sources, etc.) that are included within the amplifier.

Flicker noise can affect all electrical circuits, including bias generator circuits. Flicker noise has an inverse relationship to signal frequency. That is, flicker noise power increases as signal frequency decreases. One approach for reducing flicker noise in an amplifier is to attenuate and/or cancel flicker noise within the bias generator. In some implementations, the bias generator may include a frequency sensitive feedback circuit that cancels, at least in part, low frequency flicker noise. Bias generators are described in more detail below in conjunction with FIGS. 1, 2A, 2B and 3.

Figure 1:
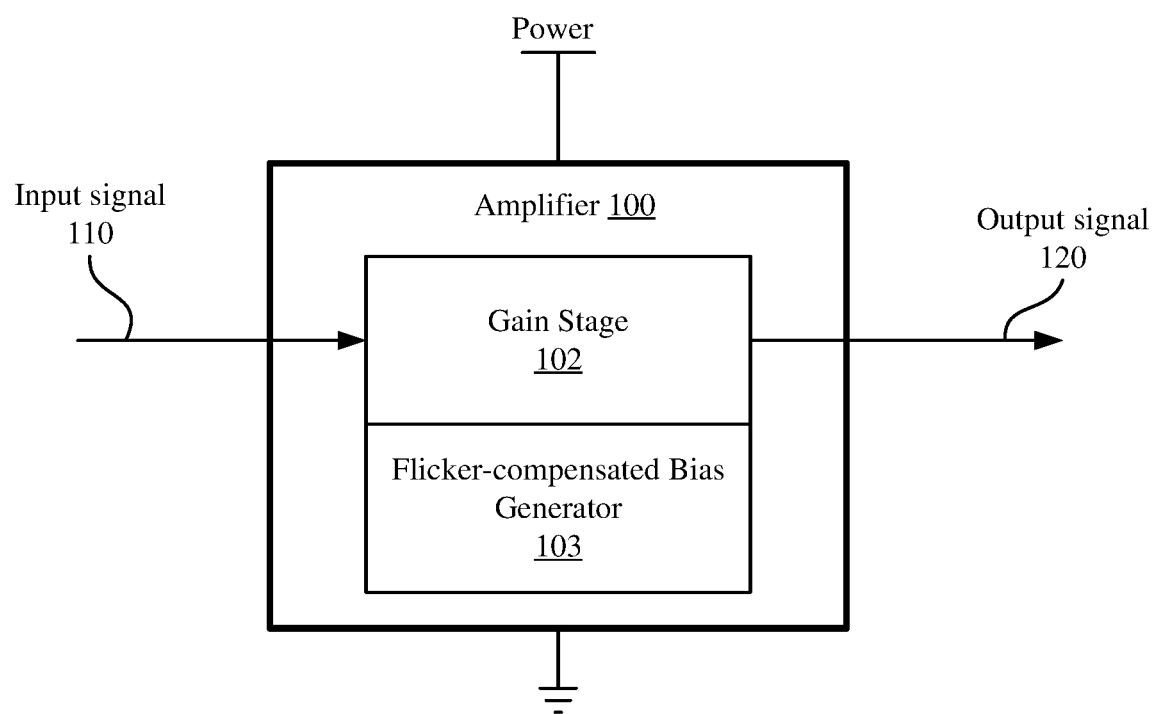
FIG. 1 shows a block diagram of an example amplifier.

FIG. 1 shows a block diagram of an example amplifier 100. The amplifier 100 may include a gain stage 102 and a flicker-compensated bias generator 103. The gain stage 102 may receive an input signal 110 through an input terminal, provide gain to the input signal 110, and generate an amplified output signal 120 through an output terminal. The input signal 110 and the output signal 120 may each be a single-ended signal or a differential signal. Persons having skill in the art will appreciate that the gain stage 102 may include any technically feasible circuits and/or modules to amplify signals, including RF signals. Such technically feasible circuits and/or modules are not discussed herein for simplicity.

In some implementations, the amplifier 100 may receive a low amplitude input signal 110, and provide an amplified output signal 120 for an RF front-end of a communication device. In some other implementations, the amplifier 100 may be a driving amplifier for receiving a modulated RF signal and amplifying the RF signal for transmission through an antenna.

The flicker-compensated bias generator 103 may provide one or more bias voltages and/or bias currents for the gain stage 102. The flicker-compensated bias generator 103 also may include one or more circuits to attenuate and/or cancel flicker noise that may affect the output signal 120. The flicker-compensated bias generator 103 is described in more detail below in conjunction with FIGS. 2A, 2B, and 3.

Figure 2A:
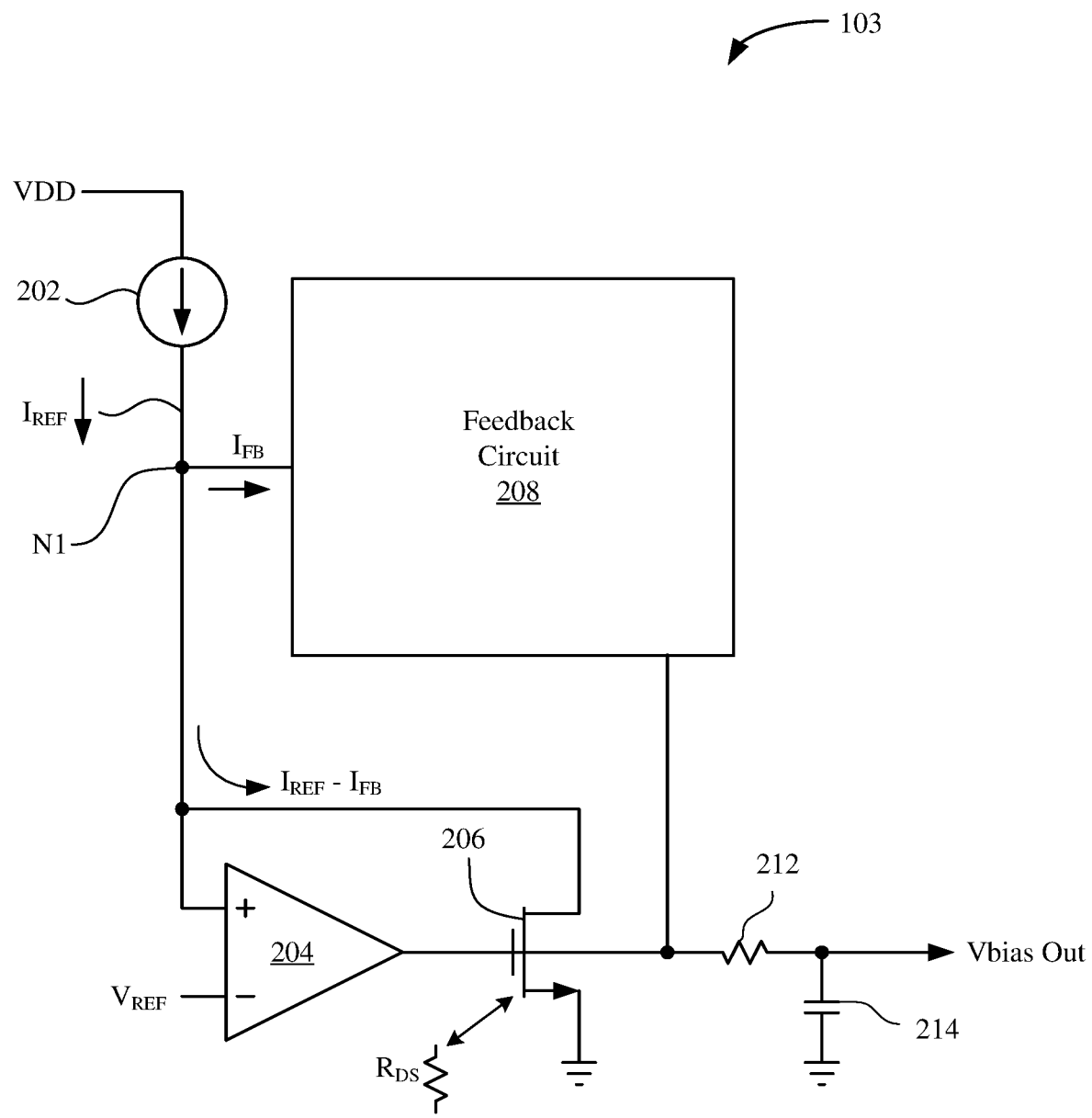
FIGS. 2A-2B show an example block diagram of a flicker-compensated bias generator.

FIG. 2A shows an example block diagram of the flicker-compensated bias generator 103 of FIG. 1. The flicker-compensated bias generator 103 may include a current source 202, an amplifier 204, a transistor 206, a feedback circuit 208, a resistor 212 and a capacitor 214. The current source 202 may provide a reference current $I_{REF}$. The feedback circuit 208 may receive (sink) a feedback current $I_{FB}$ that may be subtracted from the reference current $I_{REF}$ at node N1.

The transistor 206 may be biased by a gate voltage provided by the amplifier 204. The gate voltage from the amplifier 204 may cause a conductive channel to form between drain and source terminals of the transistor 206. In some embodiments, the source terminal of the transistor 206 may be coupled to ground. The conductive channel may have an equivalent resistance of $R_{DS}$. The amplifier 204 may have a sufficiently high input impedance such that the current ($I_{REF}-I_{FB}$) flows substantially through the conductive channel of the transistor 206 (e.g., $R_{DS}$ of the transistor 206). The voltage at node N1 generated by the current ($I_{REF}-I_{FB}$) through transistor 206 may be compared to a reference voltage $V_{REF}$ by the amplifier 204. Amplifier 204 may generate an output voltage Vbias Out based on the voltage at node N1 and $V_{REF}$. Note that the output voltage Vbias Out is the gate voltage provided to the transistor 206. In some implementations, the amplifier 204 may be referred to as a bias voltage generating amplifier. In this manner, interaction between the current ($I_{REF}-I_{FB}$), the transistor 206, and the amplifier 204 may control the Vbias Out voltage. The resistor 212 and the capacitor 214 may form for a low-pass filter to attenuate high frequency signals generated by the amplifier 204. In some implementations, the low-pass filter of the resistor 212 and the capacitor 214 may increase operational stability of flicker-compensated bias generator 103.

The feedback circuit 208 may be configured to sink the feedback current $I_{FB}$ based on the Vbias Out voltage. In some implementations, the feedback circuit 208 may sense flicker noise in the Vbias Out voltage and may control the feedback current $I_{FB}$ to attenuate and/or cancel the flicker noise. The attenuation of flicker noise is described in more detail below in conjunction with FIG. 2B.

Figure 2B:
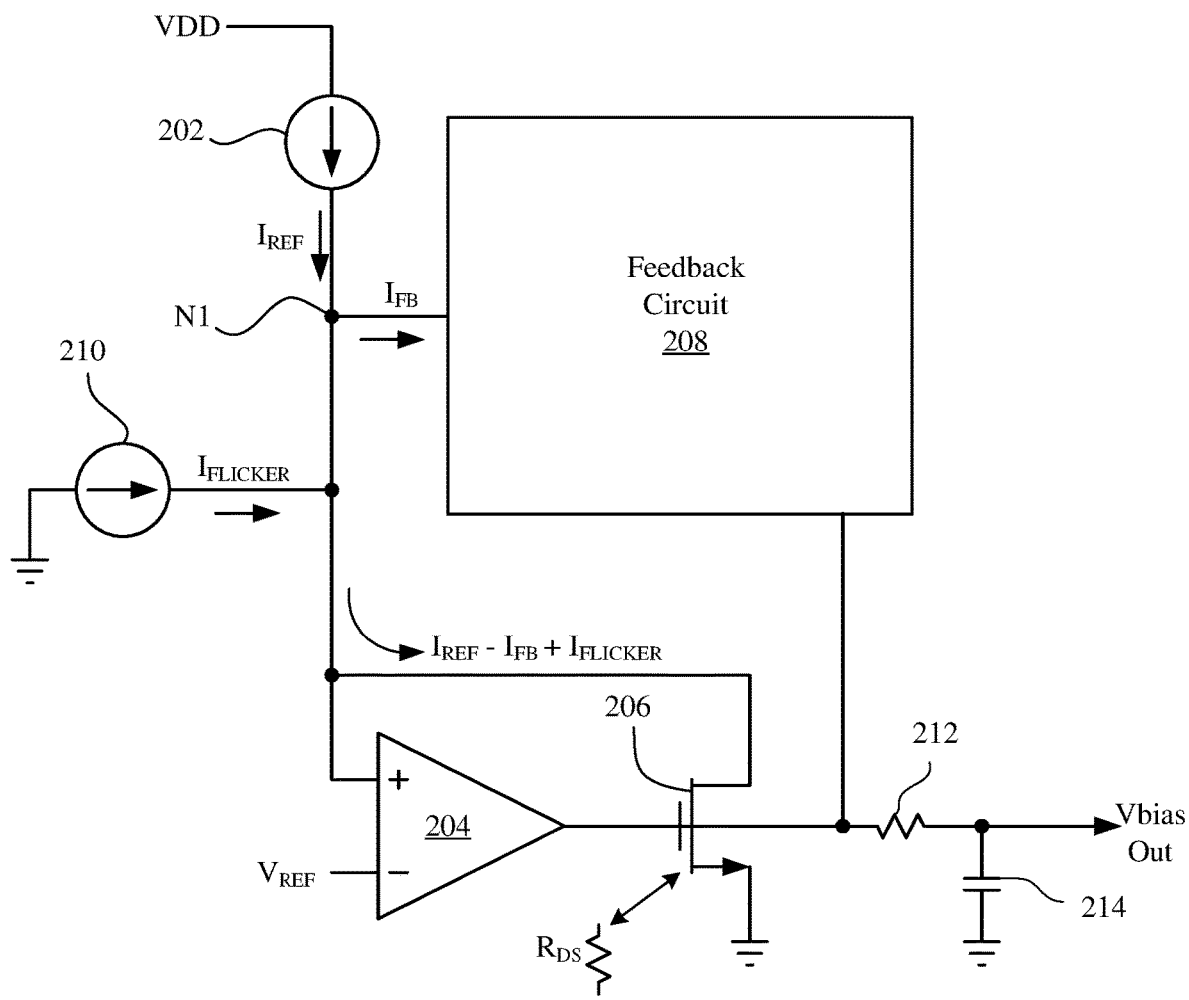

FIG. 2B shows a block diagram of the flicker-compensated bias generator 103 of FIG. 2A including a flicker noise source. Similar to FIG. 2A, the flicker-compensated includes the current source 202, the amplifier 204, the transistor 206, the feedback circuit 208, and the low-pass filter implemented with the resistor 212 and the capacitor 214. Also shown in FIG. 2B is a current source 210 which is included to model current due to flicker noise ($I_{FLICKER}$) that may be caused by the current source 202, the amplifier 204, and/or the transistor 206. The feedback circuit 208 may receive (sink) the feedback current $I_{FB}$ to cancel the flicker current $I_{FLICKER}$ (e.g., $I_{FB}=I_{FLICKER}$). In some implementations, the feedback circuit 208 may sink the feedback current $I_{FB}$ based on a frequency and magnitude of the Vbias Out voltage (e.g., the feedback circuit 208 may have a frequency dependent response to the Vbias Out voltage). For example, if the Vbias Out voltage has a direct current (DC) (e.g., zero hertz) component, then the feedback circuit 208 may sink the feedback current $I_{FB}$ based on a transfer function having a gain of zero dB or less. Similarly, if the Vbias Out voltage has alternating current (AC) components with low frequencies (e.g., signal components varying slowly, for example near zero hertz), then the feedback circuit 208 may sink the feedback current $I_{FB}$ based on a transfer function have a gain of zero dB, or a gain slightly greater than the gain associated with DC signals. As components of the Vbias Out voltage increase to greater frequencies, then the feedback circuit 208 may sink the feedback current $I_{FB}$ based on the transfer function having an even greater gain. In this manner, the feedback circuit 208 may attenuate flicker noise by providing unity gain for DC signals, low gain for signals with low frequencies (e.g., signals near DC), and high gain for other signals.

Figure 3:
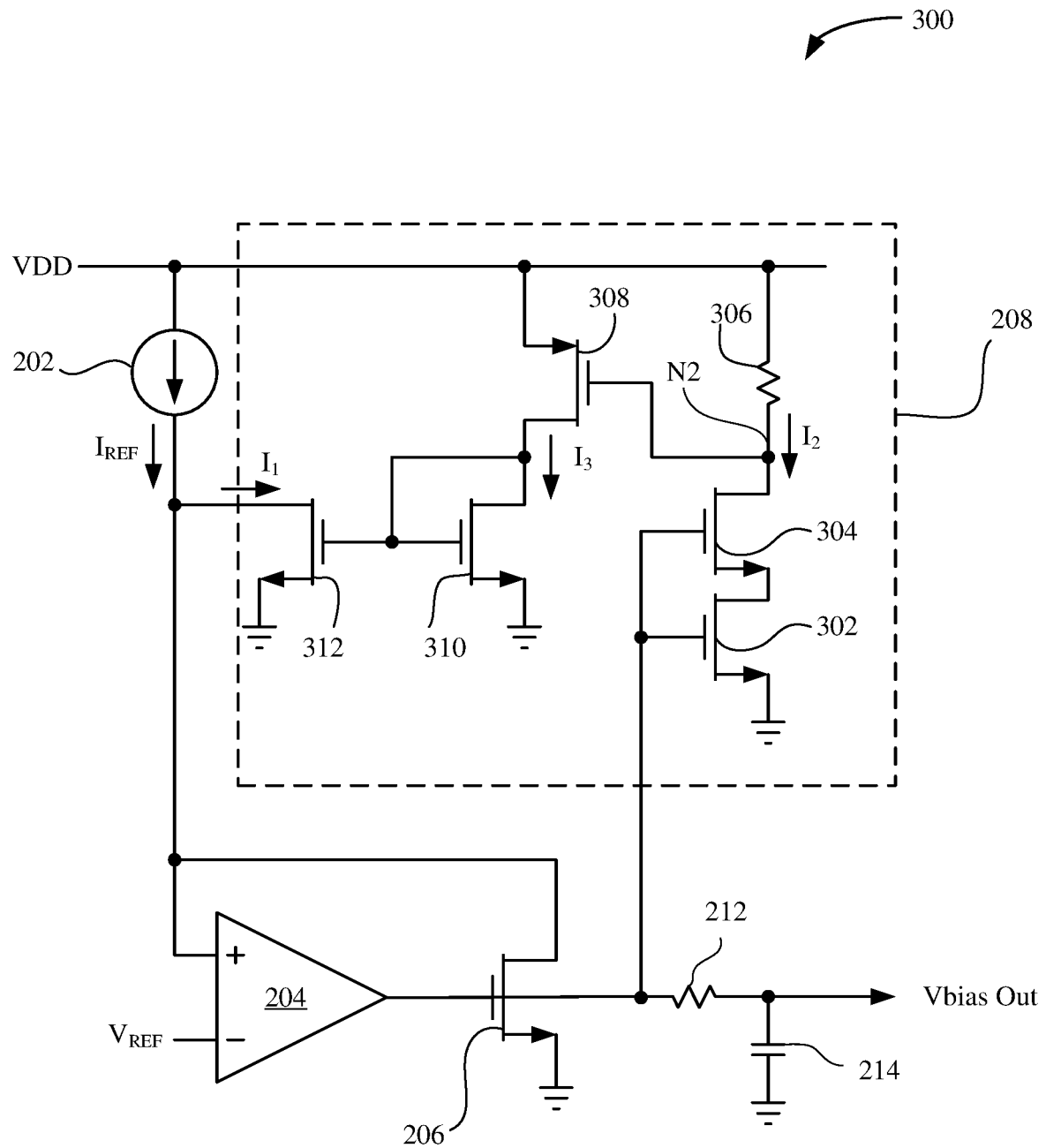
FIG. 3 is a schematic diagram of an example implementation of a flicker-compensated bias generator.

FIG. 3 is a schematic diagram of an example implementation of a flicker-compensated bias generator 300. The flicker-compensated bias generator 300 may include the current source 202, the amplifier 204, the transistor 206, the resistor 212, and the capacitor 214 as described above with respect to FIGS. 2A and 2B. The feedback circuit 208 (delineated by the dashed box) may include resistor 306 and transistors 302, 304, 308, 310, and 312.

The Vbias Out voltage from the amplifier 204 may be coupled to gate terminals of transistors 302 and 304. As shown, transistors 302 and 304 are arranged in series. A source terminal of transistor 302 is coupled to ground. A drain terminal of transistor 302 is coupled to a source terminal of transistor 304. The Vbias Out voltage may control a current $I_2$ though the transistors 302 and 304.

The resistor 306 may be coupled in series with transistors 302 and 304. Thus, the current $I_2$ may traverse through the resistor 306. The value of the resistor 306 and the current $I_2$ may determine a voltage at node N2, and therefore the voltage of a gate terminal of transistor 308. For example, the voltage at node N2 may be expressed as ($V_{DD}$–(resistance of resistor 306×current $I_2$))). The gate voltage of the transistor 308 may control current $I_3$. In this manner, current $I_3$ may be controlled at least in part by the Vbias Out voltage.

The transistors 310 and 312 also may be arranged to form a current mirror. The transistor 310 is coupled in series with the transistor 308. A source terminal of the transistor 308 may be coupled to VDD and a drain terminal of the transistor 308 may be coupled to a drain terminal of the transistor 310. A source terminal of the transistor 310 may be coupled to ground. Therefore, the current $O_3$ may flow through the transistor 310. Since the transistors 310 and 312 are configured as a current mirror, current $I_1$ (e.g., the feedback current $I_{FB}$ of FIGS. 2A and 2B) though the transistor 312 may be related to the current $I_3$ by a scaling factor associated with the current mirror transistors 310 and 312. Notably, the components of the feedback circuit 208 may determine the relationship between the current $I_2$ and the current $I_1$. In some implementations, the resistance of the resistor 306 may determine, at least in part, the response (frequency response and/or transfer function) of the feedback circuit 208. For example, as described above the current $I_1$ may be directly related to the value of resistor 306.

The voltage reference $V_{REF}$ and the current reference $I_{REF}$ together may control, at least in part, the Vbias Out voltage. Thus, choosing values for the voltage reference $V_{REF}$ and the current reference $I_{REF}$ may enable the transistors 302, 304, 306, 308, 310, and 312 to be actively biased by the Vbias Out voltage. In this manner, the feedback circuit 208 may receive (sink) a current $I_1$ (e.g., feedback current $I_{FB}$) based on flicker noise through the transistor 312.

The input to the feedback circuit 208 is a voltage (Vbias Out) and the output of the feedback circuit 208 is a current $I_1$ (e.g., feedback current $I_{FB}$). The gain from the input voltage Vbias Out to the output current $I_1$ may be expressed as a transconductance gm. The transconductance gm may express a ratio of output current to input voltage. For example:

$$g_m = \frac{I_1}{Vbias\ Out}$$

In some implementations, the gain of the feedback circuit 208 may be a frequency (f) dependent transfer function. For example:

$$g_m(f) = \begin{cases} g_m <= 0\ dB, & f = 0 \\ g_m > 0\ dB, & f > 0 \end{cases}$$

Since flicker noise is associated with DC (zero hertz) signals, a gain that is less than or equal to 1 (less than or equal to zero dB) for DC signals may help attenuate flicker noise. Moreover, a gain greater than 1 (greater than zero dB) for AC signals may enable the flicker-compensated bias generator 300 to provide a stable Vbias Out voltage based upon $V_{REF}$ and operation of the transistor 206 for non-DC signals. In this manner, the feedback circuit 208 may generate a feedback current $I_1$ to attenuate and/or cancel flicker noise. Of note, flicker noise may be attenuated without adding additional R-C networks or without increasing feature sizes of included devices.

Figure 4:
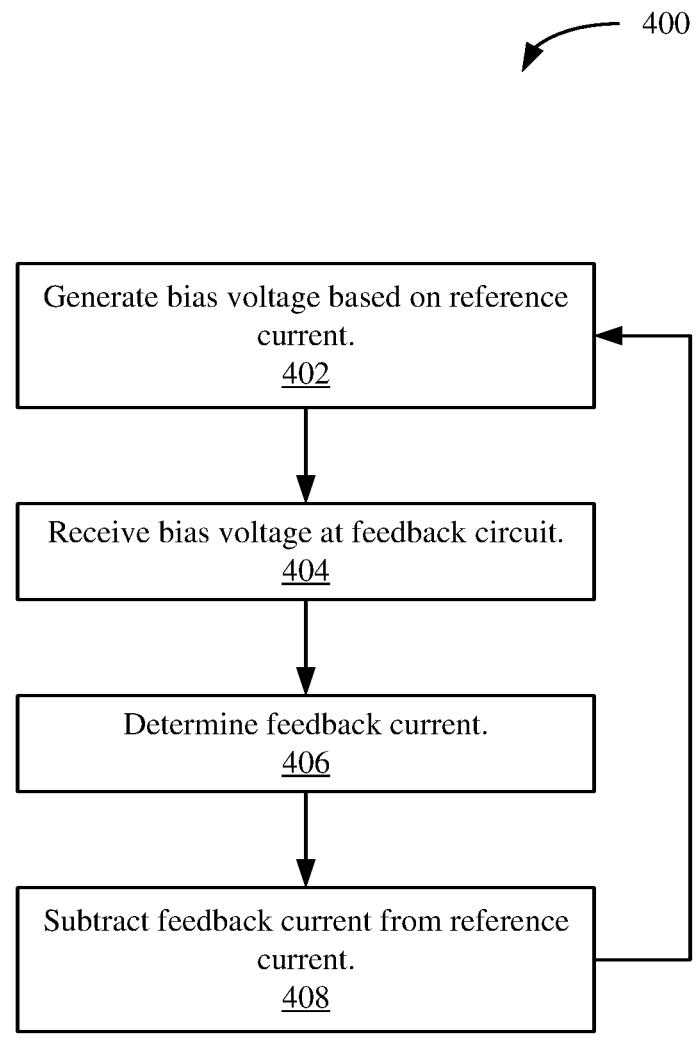
FIG. 4 is a flowchart depicting an example operation for operating the flicker-compensated bias generator of FIG. 3.

FIG. 4 is a flowchart depicting an example operation 400 for operating the flicker-compensated bias generator 300 of FIG. 3. The operation 400 begins as a bias voltage Vbias Out is generated based on a reference current (402). As described above with respect to FIGS. 2A, 2B, and 3, the Vbias voltage may be generated by the amplifier 204 based, at least in part, on a reference current $I_{REF}$ and a reference voltage $V_{REF}$. Next, the bias voltage Vbias Out is received by the feedback circuit 208 (404). For example, the Vbias Out voltage signal may be received by one or more transistors (e.g., transistors 302 and 304) of the feedback circuit 208. The Vbias Out signal may include flicker noise. Next, the feedback circuit 208 may determine the feedback current $I_{FB}$ based on the Vbias Out signal (406). As described above with respect to FIG. 3, the feedback circuit 208 may determine a feedback current $I_{FB}$ based on flicker noise in the Vbias Out signal. Next, the feedback current $I_{FB}$ may be subtracted from the reference current $I_{REF}$ to attenuate flicker noise (408). In some implementations, the transistor 312 of the feedback circuit may subtract the feedback current $I_{FB}$ from the reference current $I_{REF}$. Operation returns to 402.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, or combinations of both.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A bias voltage generator comprising:
   an amplifier comprising:
     a first input terminal configured to receive a reference voltage;
     a second input terminal; and
     an output terminal configured to provide an output bias voltage; and
   a feedback circuit comprising:
     an input terminal coupled to the output terminal of the amplifier;
     a first transistor;
     a second transistor, wherein a source terminal of the first transistor is coupled to a drain terminal of the second transistor, a source terminal of the second transistor is coupled to ground, and a gate terminal of the second transistor and a gate terminal of the first transistor are coupled to the input terminal of the feedback circuit; and
     an output terminal coupled to the second input terminal of the amplifier and configured to sink a first current, wherein a magnitude of the first current is based on a direct current (DC) output voltage of the amplifier.

2. The bias voltage generator of claim 1, wherein the feedback circuit further comprises:
a third transistor coupled to the output terminal and configured to sink the first current.

3. The bias voltage generator of claim 1, wherein the magnitude of the first current is based on variations of the output bias voltage.

4. The bias voltage generator of claim 1, wherein the first transistor and the second transistor are configured to sink a second current based on a voltage of the gate terminals of the first transistor and the second transistor.

5. The bias voltage generator of claim 4, further comprising a fourth transistor configured to generate a third current based on the second current.

6. The bias voltage generator of claim 5, wherein the feedback circuit further comprises:
a current minor configured to receive the third current and sink the first current.

7. The bias voltage generator of claim 6, wherein the current mirror comprises a fifth transistor configured to sink the third current.

8. The bias voltage generator of claim 1, further comprising:
a gate terminal of a sixth transistor coupled to the output terminal of the amplifier;
a source terminal of the sixth transistor coupled to ground; and
a drain terminal of the sixth transistor coupled to the second input terminal of the amplifier.

9. An amplifier comprising:
a gain stage configured to provide an output signal based at least in part on an input signal and an output bias voltage; and
a bias generator comprising:
a bias-generating amplifier comprising:
a first input terminal configured to receive a reference voltage;
a second input terminal; and
an output terminal configured to provide the output bias voltage; and
a feedback circuit comprising:
an input terminal coupled to the output terminal of the bias-generating amplifier;
a first transistor;
a second transistor, wherein a source terminal of the first transistor is coupled to a drain terminal of the second transistor, a source terminal of the second transistor is coupled to ground, a gate terminal of the second transistor and a gate terminal of the first transistor are coupled to the input terminal of the feedback circuit; and
an output terminal coupled to the second input terminal of the bias-generating amplifier and configured to sink a first current, wherein a magnitude of the first current is based on a direct current (DC) output voltage of the bias-generating amplifier.

10. The amplifier of claim 9 wherein the feedback circuit further comprises:
a third transistor coupled to the output terminal and configured to sink the first current.

11. The amplifier of claim 9, wherein the magnitude of the first current is based on variations of the output bias voltage.

12. The amplifier of claim 9, wherein the first transistor and the second transistor are configured to sink a second current based on a voltage of the gate terminals of the first transistor and the second transistor.

13. The amplifier of claim 12, further comprising a fourth transistor configured to generate a third current based on the second current.

14. The amplifier of claim 13, wherein the feedback circuit further comprises:
a current mirror configured to receive the third current and sink the first current.

15. The amplifier of claim 14, wherein the current mirror comprises a fifth transistor configured to sink the third current.

16. A bias voltage generator comprising:
an amplifier comprising:
a first input terminal configured to receive a reference voltage;
a second input terminal; and
an output terminal configured to provide an output bias voltage;
a feedback circuit comprising:
an input terminal coupled to the output terminal of the amplifier; and
an output terminal coupled to the second input terminal of the amplifier and configured to sink a first current, wherein a magnitude of the first current is based on a direct current (DC) output voltage of the amplifier; and
a transistor comprising:
a gate terminal coupled to the output terminal of the amplifier;
a source terminal coupled to ground; and
a drain terminal coupled to the second input terminal of the amplifier.

* * * * *